(12) United States Patent
Nozaki et al.

(10) Patent No.: US 7,733,105 B2
(45) Date of Patent: Jun. 8, 2010

(54) VOLTAGE CLAMP CIRCUIT AND SEMICONDUCTOR DEVICE, OVERCURRENT PROTECTION CIRCUIT, VOLTAGE MEASUREMENT PROBE, VOLTAGE MEASUREMENT DEVICE AND SEMICONDUCTOR EVALUATION DEVICE RESPECTIVELY USING THE SAME

(75) Inventors: Yoshiaki Nozaki, Iga (JP); Hiroshi Kawamura, Kashihara (JP); John Kevin Twynam, Yamatokoriyama (JP); Masatomo Hasegawa, Nara (JP)

(73) Assignee: Sharp Kabushiki Kaisha, Osaka-Shi (JP)

( * ) Notice: Subject to any disclaimer, the term of this patent is extended or adjusted under 35 U.S.C. 154(b) by 49 days.

(21) Appl. No.: 12/139,288

(22) Filed: Jun. 13, 2008

(65) Prior Publication Data

US 2008/0309355 A1 Dec. 18, 2008

(30) Foreign Application Priority Data

Jun. 15, 2007 (JP) .......................... P2007-159032

(51) Int. Cl.
*G01R 31/02* (2006.01)
(52) U.S. Cl. .................... 324/754; 324/72.5
(58) Field of Classification Search ............... 324/754, 324/72.5; 323/313

See application file for complete search history.

(56) References Cited

U.S. PATENT DOCUMENTS

| 4,314,167 | A | | 2/1982 | Groves et al. |
| 4,939,450 | A | | 7/1990 | Milberger et al. |
| 6,137,278 | A | * | 10/2000 | Koffler et al. ............... 323/313 |
| 7,372,291 | B2 | * | 5/2008 | Ng ............................... 326/21 |
| 7,532,445 | B2 | * | 5/2009 | Rana et al. .................... 361/56 |

FOREIGN PATENT DOCUMENTS

| JP | 11-311644 A | 11/1999 |
| JP | 2001-4670 A | 1/2001 |

\* cited by examiner

*Primary Examiner*—Ha Tran T Nguyen
*Assistant Examiner*—Arleen M Vazquez
(74) *Attorney, Agent, or Firm*—Birch, Stewart, Kolasch & Birch, LLP

(57) ABSTRACT

In a voltage clamp circuit, a normally-on type field-effect transistor having a negative threshold voltage has a drain connected to an input node, a source connected to an output node and grounded via a resistance element, and a gate supplied with an output voltage of a variable direct-current power supply. When a voltage at the output node becomes higher than a clamping voltage because of voltage drop of the resistance element, the field-effect transistor is tuned off. Accordingly, the output voltage is limited to be at most the clamping voltage. Thus, a response speed is higher than those of conventional voltage clamp circuits using diodes or the like.

10 Claims, 6 Drawing Sheets

FIG.1
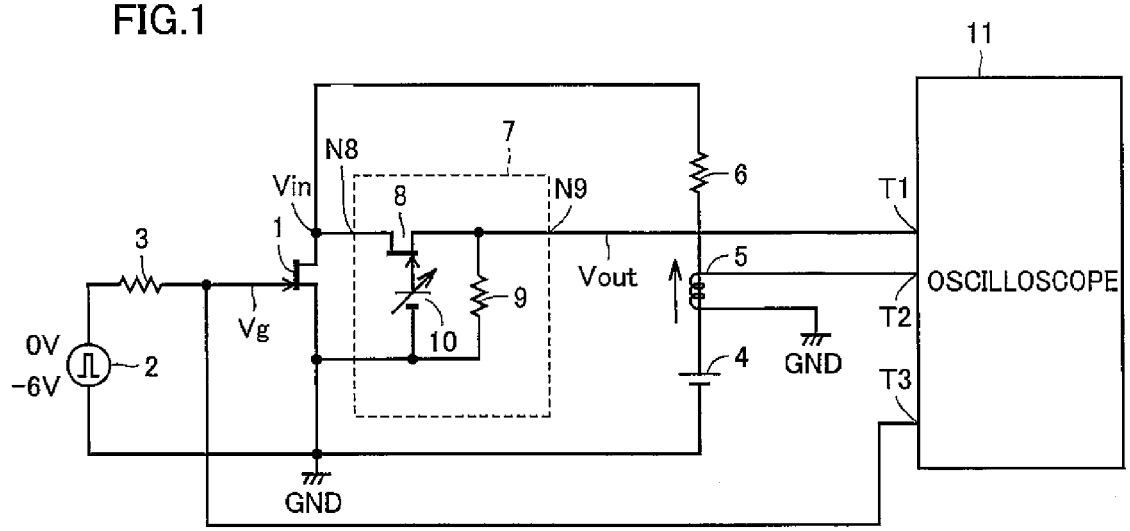
FIG.2A
FIG.2B
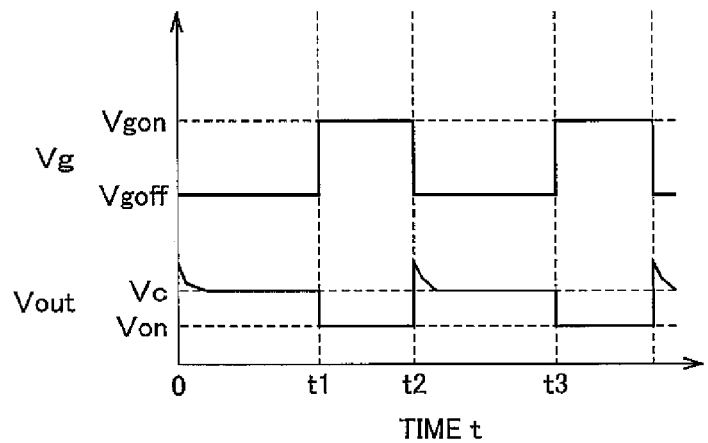

FIG.11A PRIOR ART Vg

FIG.11B PRIOR ART Vout

US 7,733,105 B2

VOLTAGE CLAMP CIRCUIT AND SEMICONDUCTOR DEVICE, OVERCURRENT PROTECTION CIRCUIT, VOLTAGE MEASUREMENT PROBE, VOLTAGE MEASUREMENT DEVICE AND SEMICONDUCTOR EVALUATION DEVICE RESPECTIVELY USING THE SAME

This nonprovisional application is based on Japanese Patent Application No. 2007-159032 filed on Jun. 15, 2007 with the Japan Patent Office, the entire contents of which are hereby incorporated by reference.

BACKGROUND OF THE INVENTION

1. Field of the Invention

The present invention relates to a voltage clamp circuit, and a semiconductor device, an overcurrent protection circuit, a voltage measurement probe, a voltage measurement device, and a semiconductor evaluation device respectively using the voltage clamp circuit. More particularly, the present invention relates to a voltage clamp circuit that transmits an input voltage to an output node when the input voltage is lower than a clamping voltage and that fixes a voltage at the output node to the clamping voltage when the input voltage is higher than the clamping voltage, and a semiconductor device, an overcurrent protection circuit, a voltage measurement probe, a voltage measurement device, and a semiconductor evaluation device respectively using the voltage clamp circuit.

2. Description of the Background Art

Recently, high breakdown voltage semiconductor switching elements such as field-effect transistors (FETs) and insulated gate bipolar transistors (IGBTs) have achieved high performance as the development of power electronics has advanced. In particular, since achieving low loss is the most important challenge, on-resistance, which is directly linked to loss of power, needs to be as low as possible. For this purpose, accurate measurement of on-resistance is indispensable. Recent high breakdown voltage semiconductor switching elements frequently perform high-speed operations, and therefore only the on-resistance calculated from the direct-current (DC) characteristics is not sufficient as a guideline for the performance. To provide an effective performance guideline during the switching operation, the dynamic on-resistance is to be measured. This dynamic on-resistance measurement, however, involves difficulties.

That is, in a semiconductor switching element during the switching operation, the high voltage and low current state (during the off-state) repeatedly alternates with the low voltage and high current state (during the on-state). The measurement of dynamic on-resistance is typically performed by observing waveforms using an oscilloscope to allow changes with time from the high voltage and low current state (during the off-state) to the low voltage and high current state (during the on-state) to be followed.

In measurements of voltage waveforms with an oscilloscope, unless the voltage waveforms are within the same range both during the on-state and during the off-state, the characteristics of an amplifier inside the oscilloscope are distorted, resulting in failure to accurately measure the voltage waveforms. The voltage waveforms therefore need to be measured in a range wide enough for high voltage during the off-state, that is, the power supply voltage. This, however, reduces the accuracy of the measurement for low voltage, which is necessary for the measurement of dynamic on-resistance. For example, in a case where the voltage during the on-state is O.1 V and the power supply voltage is 100 V, an oscilloscope has to be set in a range not less than 100 V. In this case, even if the accuracy of a high-accuracy oscilloscope is 1% of the full scale, the accuracy is 1 V with a voltage range of 100 V. The measured value is completely unreliable. To address this issue, a semiconductor evaluation device that can measure voltage between terminals of a semiconductor switching element in a low voltage range has been devised.

FIG. 10 is a circuit diagram showing a configuration of such a semiconductor evaluation device. In the semiconductor evaluation device shown in FIG. 10, a source of a semiconductor switching element (N-type field-effect transistor) 70 to be evaluated is grounded, a gate thereof is connected via a resistance element 71 to a pulse generating circuit 72, and a drain thereof is connected via a resistance element 73 and a current detector 74 to a DC power supply 75. The drain of semiconductor switching element 70 is connected via a voltage clamp circuit 76 to a first input terminal T1 of an oscilloscope 80, and a second input terminal T2 and a third input terminal T3 of oscilloscope 80 are connected to current detector 74 and the gate of semiconductor switching element 70, respectively.

Voltage clamp circuit 76 includes a resistive element 77 connected between an input node N77 and an output node N78, and a diode 78 and a Zener diode 79 connected in series between output node N78 and the line of a ground voltage GND. Input node N77 is connected to the drain of semiconductor switching element 70, and output node N78 is connected to first input terminal T1 of oscilloscope 80. The resistance value of resistive element 77 is, e.g., 1 MΩ, and a Zener voltage Vz of Zener diode 79 is, e.g., 2 V. Accordingly, a voltage Vout at output node N78 is limited to be at most Vz, and therefore the range of the voltage at first input terminal T1 of oscilloscope 70 may be set to one wide enough for Vz.

FIG. 11A is a time chart showing a gate voltage Vg of semiconductor switching element 70, and FIG. 11B is a time chart showing output voltage Vout of voltage clamp circuit 76. Gate voltage Vg is alternately switched between a low voltage Vgoff and a high voltage Vgon. When Vg is Vgoff, semiconductor switching element 70 is turned of, so that a drain voltage Vin of semiconductor switching element 70 becomes approximately DC power supply voltage (100 V) while output voltage Vout of voltage clamp circuit 76 is fixed to a clamping voltage Vc=Vz. When Vg is raised from Vgoff to Vgon, semiconductor switching element 70 is turned on, so that drain voltage Vin abruptly drops, and when Vin becomes not more than Vc=Vz, Vout=Vin. For example, if the measurement is performed in a voltage range of 2 V by using oscilloscope 80 having a resolution of 10 bits, the measurement accuracy is 0.002 V, sufficiently allowing the measurement of an on-state voltage of 0.1 V.

There is also a semiconductor evaluation device in which with a switch connected between a semiconductor switching element and an oscilloscope, the voltage between terminals of the semiconductor switching element is compared with the reference voltage and the switch is turned on as the voltage between terminals becomes lower than the reference voltage (see, for example, Japanese Patent Laying-Open No. 2001-004670).

In conventional voltage clamp circuit 76, however, if gate voltage Vg is raised from low voltage Vgoff to high voltage Vgon (time t1), output voltage Vout is gradually decreased to on-state voltage Von because of time delay due to the CR time constant caused by resistive element 77 and parasitic capacitance and time delay due to the recovery time (reverse recovery time) of diodes 78 and 79. Thus, there has been a problem in that during high-speed operations in which the period of turning on and off of semiconductor switching element 70 is less than 1 microsecond, the characteristics of semiconductor switching element 70 cannot be accurately evaluated.

In addition, in a device that is switched on as the voltage between terminals of a semiconductor switching element becomes lower than the reference voltage, the response speed of the switch is several hundred nanoseconds. With this device, the characteristics of a semiconductor switching element have been unable to be accurately evaluated during high-speed operations in which the on/off period of semiconductor switching element 70 is less than 1 microsecond.

SUMMARY OF THE INVENTION

It is thus a principal object of the present invention to provide a voltage clamp circuit having a high response speed, and a semiconductor device, an overcurrent protection circuit, a voltage measurement probe, a voltage measurement device, and a semiconductor evaluation device respectively using the voltage clamp circuit.

In a voltage clamp circuit according to an aspect of the present invention, a normally-on type field-effect transistor having a negative threshold voltage and a resistance element are provided. The field-effect transistor includes a drain connected to the input node, a source connected to the output node, and a gate receiving a first reference voltage. The resistance element has an electrode on one side connected to the output node and an electrode on another side receiving a second reference voltage. The clamping voltage is a voltage of the sum of the absolute value of the threshold voltage of the field-effect transistor and the first reference voltage. Therefore, there is no delay caused by a resistance element and a diode as found in conventional voltage clamp circuits. This allows achievement of high response speed.

Preferably, the field-effect transistor is made of a wide band-gap semiconductor. In this case, improvements in breakdown voltage and enhancement in operation speed of the field-effect transistor can be achieved.

In a voltage clamp circuit according to another aspect of the present invention, first to Nth (where N is an integer not less than 2) normally-on type field-effect transistors each having a negative threshold voltage and first to Nth resistance elements are provided. The drains of the first to Nth field-effect transistors are all connected to the input node, the gate of the first field-effect transistor receives a first reference voltage, and the sources of the first to (N−1)th field-effect transistors are connected to the gates of the second to Nth field-effect transistors, respectively, and the source of the Nth field-effect transistor is connected to the output node. The first to Nth resistance elements have electrodes on one side connected to the sources of the first to Nth field-effect transistors, respectively, and electrodes on another side all receiving a second reference voltage. The clamping voltage is a voltage of the sum of the total sum of the absolute values of the threshold voltages of the first to Nth field-effect transistors and the first reference voltage. Therefore, there is no delay caused by a resistance element and a diode as found in conventional voltage clamp circuits. This allows achievement of high response speed. A voltage clamp circuit can be made even with a small threshold voltage of a field-effect transistor.

Preferably, each of the first to Nth field-effect transistors is formed of a wide band-gap semiconductor. In this case, improvements in breakdown voltage and enhancement in operation speed of the first to Nth field-effect transistors can be achieved.

Also preferably, the first reference voltage is a positive voltage and the second reference voltage is a ground voltage.

In this case, the clamping voltage can be adjusted by adjusting the first reference voltage, which is a positive voltage.

Also preferably, each of the first and second reference voltages is a ground voltage. In this case, simplification of the configuration can be achieved.

A semiconductor device and an overcurrent protection circuit according to other aspects of the present invention each include the foregoing voltage clamp circuit, and therefore the voltage between terminals of a semiconductor switching element can be easily detected.

A voltage measurement probe, a voltage measurement device and a semiconductor evaluation device according to other aspects of the present invention each include the foregoing voltage clamp circuit, and therefore the dynamic on-resistance of a semiconductor switching element can be easily measured.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a circuit block diagram showing a configuration of a semiconductor evaluation device according to a first embodiment of the present invention.

FIG. 2A is a time chart showing operations of the semiconductor evaluation device shown in FIG. 1.

FIG. 2B is a time chart showing operations of the semiconductor evaluation device shown in FIG. 1.

FIG. 11A is a time chart showing operations of the semiconductor evaluation device shown in FIG. 10.

FIG. 11B is a time chart showing operations of the semiconductor evaluation device shown in FIG. 10.

DESCRIPTION OF THE PREFERRED EMBODIMENTS

First Embodiment

Figure 3:
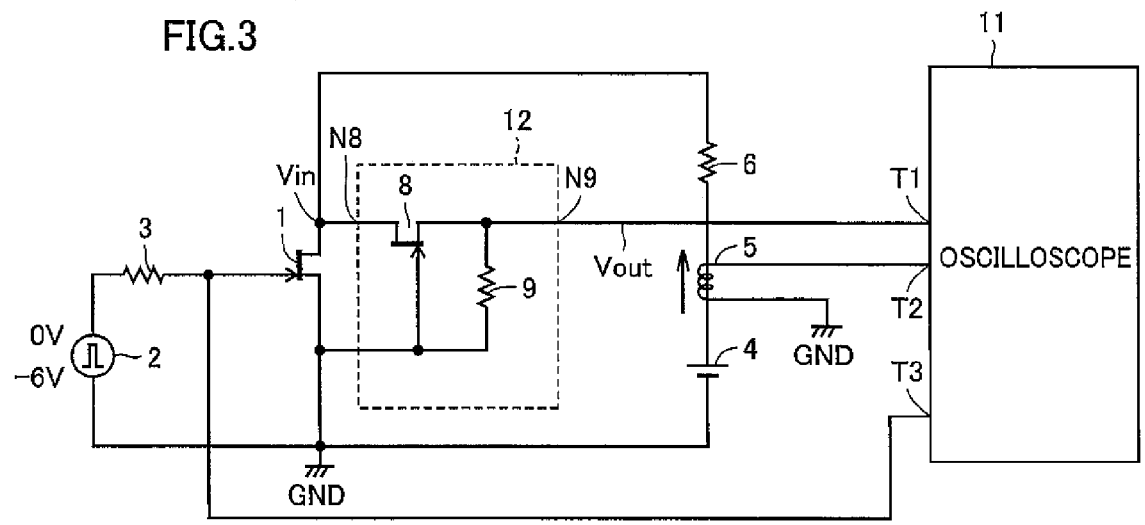
FIG. 3 shows a modification of the first embodiment.

FIG. 1 is a circuit block diagram showing a configuration of a semiconductor evaluation device according to the first embodiment of the present invention. In FIG. 1, the semiconductor evaluation device is for measuring a dynamic on-resistance and the like of a semiconductor switching element (N-type field-effect transistor) 1 to be evaluated, and includes a pulse generating circuit 2, resistance elements 3 and 6, a DC power supply 4, a current detector 5, a voltage clamp circuit 7, and an oscilloscope 11.

A source of semiconductor switching element 1 is grounded, a gate thereof is connected via resistance element 3 to pulse generating circuit 2, and a drain thereof is connected via resistance element 6 and current detector 5 to DC power supply 4. The resistance value of load-resistance element 6 is, e.g., 1 kΩ and the output voltage of DC power supply 4 is, e.g., 100 V.

The drain of semiconductor switching element 1 is connected via voltage clamp circuit 7 to first input terminal T1 of oscilloscope 11, and second input terminal T2 and a third input terminal T3 of oscilloscope 11 are connected to current detector 5 and the gate of semiconductor switching element 1, respectively.

Voltage clamp circuit 7 includes a normally-on type field-effect transistor 8, a resistance element 9 and a DC power supply 10 whose output voltage can be adjusted field-effect transistor 8 has a negative threshold voltage (e.g., −2V), and a drain thereof is connected to an input node N8, a source thereof is connected to an output node N9, and a gate thereof receives the output voltage (e.g., 2V) of DC power supply 10. As field-effect transistor 8, an element having high breakdown voltage and being capable of operating at high speed is desirable, and elements made of so-called wide band-gap semiconductors including nitride semiconductors such as GaN and AlGaN and SiC are suitable. An element formed of GaN is used here as field-effect transistor 8.

Resistance element 9 is connected between output node N9 and the line of ground voltage GND. Input node N8 is connected to the drain of semiconductor switching element 1, and output node N9 is connected to first input terminal T1 of oscilloscope 11. The resistance value of resistance element 9 is, e.g., 20 kΩ. Note that an electrode on one side of resistance element 9 may be connected to the output terminal of a DC power supply whose output voltage can be adjusted, instead of the line of ground voltage GND.

Due to the normally-on type of field-effect transistor 8, when a current flows through resistance element 9 to cause the voltage drop of resistance element 9, the voltage drop causes an increase of the voltage on the source side of field-effect transistor 8. At this point, when the difference voltage between the gate voltage (2 V) and source voltage Vout of field-effect transistor 8 becomes lower than the threshold voltage (−2 V), field-effect transistor 8 is turned off, causing voltage Vout at output node N9 to be clamped to the clamping voltage Vc=−(−2 V)+2 V=4 V. Accordingly, voltage Vout at output node N9 is limited to be at most Vc, and therefore the range of the voltage at first input terminal T1 of oscilloscope 11 may be set to one wide enough for Vc.

With connections made as described above, gate voltage Vg of semiconductor switching element 1, output voltage Vout of voltage clamp circuit 7 and the output current of DC power supply 4 are measured with oscilloscope 11. Gate voltage Vg is used as a trigger of the time base sweep of oscilloscope 11.

FIG. 2A is a time chart showing gate voltage Vg of semiconductor switching element 1, and FIG. 2B is a time chart showing output voltage Vout of voltage clamp circuit 7. Gate voltage Vg is alternately switched between low voltage Vgoff and high voltage Vgon. When Vg becomes Vgoff, semiconductor switching element 1 is turned off, so that drain voltage Vin of semiconductor switching element 1 becomes approximately equal to DC power supply voltage (100 V) while output voltage Vout of voltage clamp circuit 7 is fixed to clamping voltage Vc.

When Vg is raised from Vgoff to Vgon, semiconductor switching element 1 is turned on, so that drain voltage Vin abruptly drops, and when Vin becomes not more than Vc, Vout=Vin. The on-resistance of semiconductor switching element 1 is 30Ω. Vin becomes the voltage obtained by dividing DC power supply voltage (100 V) by the on-resistance (30Ω) of semiconductor switching element 1 and the resistance value (1 kΩ) of load-resistance element 6, and Vin=2.91 V in this first embodiment. At this point, field-effect transistor 8 is in the on-state. In such field-effect transistor 8, source voltage Vout=Vin is 2.91 V, so that the difference between the gate voltage (2 V) and the source voltage (2.91 V) is 2 V−2.91 V=−0.91 V. Since the threshold voltage of field-effect transistor 8 is −2V, the on-state of field-effect transistor 8 is maintained with a difference between the gate voltage and the source voltage of −0.91 V. Drain voltage Vin of semiconductor switching element 1 appears at output node N9 of voltage clamp circuit 7.

Therefore, by setting the full scale of oscilloscope 11 to 4 V, oscilloscope 11 is not saturated even at a time point of the off-state of semiconductor switching element 1 and the on-voltage is measured with an accuracy of 0.04 V when the accuracy of oscilloscope 11 is 1%. Thus, the on-resistance of semiconductor switching element 1 can be obtained.

The delay time of voltage clamp circuit 7 will now be considered. In voltage clamp circuit 7, the source-to-gate, drain-to-gate and source-to-drain parasitic capacitances of field-effect transistor 8 exist. The operations of semiconductor switching element 1 when changing from the off-state to the on-state can be divided into two regions: a first region in which drain voltage Vin of semiconductor switching element 1 changes from the power supply voltage (100 V) to clamping voltage Vc (=4 V), and a second region in which the drain voltage Vin changes from clamping voltage Vc (=4 V) to on-state voltage Von of semiconductor switching element 1.

Figure 10:
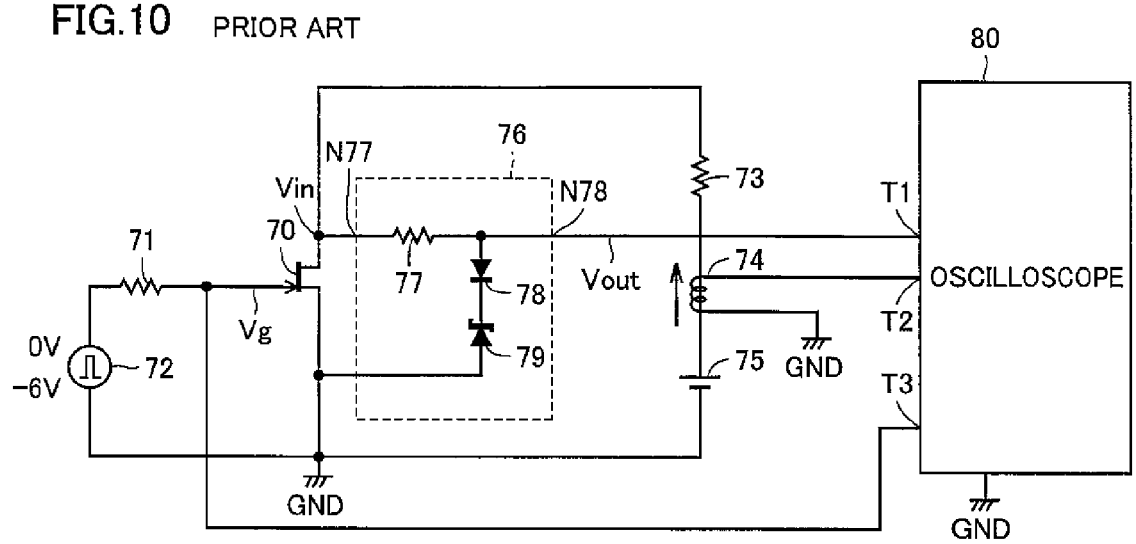
FIG. 10 is a circuit block diagram showing a configuration of a conventional semiconductor evaluation device.
Figure 10:
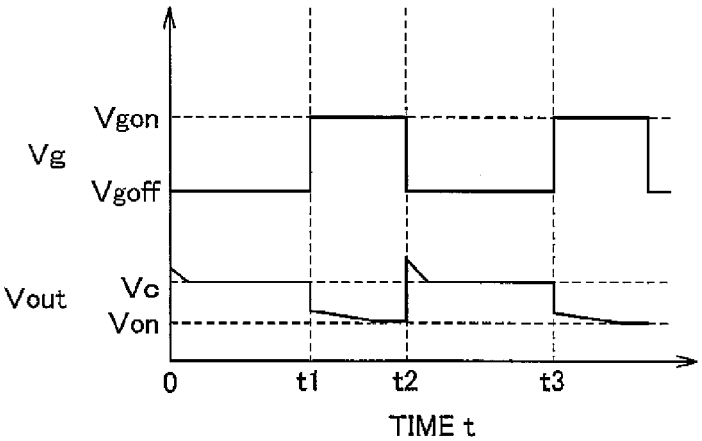

In the above first region, although the drain-to-gate voltage and the drain-to-source voltage of semiconductor switching element 1 largely change, the drain-to-gate capacitance and the drain-to-source capacitance are relatively small. Therefore, the delay time is small. Further, the drive impedance is determined by load-resistance element 6 and the current drive capability of semiconductor switching element 1 and is considerably low as compared to that of the device shown in FIG. 10.

In the above second region, the gate-to-source voltage begins to change. Although the gate-to-source capacitance is large to some extent as compared to the gate-to-drain capacitance and the like, the impedance to drive the gate-to-source capacitance is considerably low because of the on-state of field-effect transistor 8, allowing voltage clamp circuit 7 to operate at high speed.

Field-effect transistor 8 needs only to be able to drive measurement devices such as oscilloscope 11, and therefore considerably small elements can be used as field-effect transistor 8. In this first embodiment, the total parasitic capacitance of oscilloscope 11, field-effect transistor 8 and the like is about 50 pF, clamping voltage Vc is about 4 V, the on-voltage of semiconductor switching element 1 is about 1 V, and the drain current of field-effect transistor 8 is about 50 mA, and therefore the rise/fall time trf of output voltage Vout of voltage clamp circuit 7 is such that trf=ΔV·Cin/Iin=(4−1)·50 pF/50 mA=3 ns. In the measurement, the rise time of pulses for turning on/off semiconductor switching element 1 is not less than 5 ns in order to prevent the distortion of waveforms caused by the parasitic inductance, so that sufficiently high measurement speed is obtained.

FIG. 3 is a circuit block diagram showing a modification of the first embodiment, which is to be compared with FIG. 1. With reference to FIG. 3, the semiconductor evaluation device differs from the semiconductor evaluation device of FIG. 1 in that voltage clamp circuit 7 is replaced by a voltage clamp circuit 12. Voltage clamp circuit 12 is obtained by removing DC power supply 10 from voltage clamp circuit 7 and grounding the gate of field-effect transistor 8.

Due to the normally-on type of field-effect transistor 8, when a current flows through resistance element 9 to cause the voltage drop of resistance element 9, the voltage drop causes an increase of the voltage on the source side of field-effect transistor 8. At this point, when the difference voltage between the gate voltage (0 V) and source voltage Vout of field-effect transistor 8 becomes lower than the threshold voltage (−2 V), field-effect transistor 8 is turned off, causing voltage Vout at output node N9 to be clamped to clamping voltage Vc=−(−2 V)+0 V=2 V. Accordingly, voltage Vout at output node N9 is limited to be at most Vc, and therefore the range of the voltage at first input terminal T1 of oscilloscope 11 may be set to one wide enough for Vc.

When Vg is raised from Vgoff to Vgon, semiconductor switching element 1 is turned on, so that drain voltage Vin abruptly drops, and when Vin becomes not more than Vc, Vout=Vin. The on-resistance of semiconductor switching element 1 to be evaluated is 10Ω. Vin becomes the voltage obtained by dividing DC power supply voltage (100 V) by the on-resistance (10Ω) of semiconductor switching element 1 and the resistance value (1 kΩ) of load-resistance element 6, and Vin=0.99 V in this first embodiment. At this point, field-effect transistor 8 is in the on-state. In such field-effect transistor 8, source voltage Vout=Vin is 0.99 V, so that the difference between the gate voltage (0 V) and the source voltage (0.99 V) is 0 V−0.99 V=−0.99 V. Since the threshold voltage of field-effect transistor 8 is −2V, the on-state of field-effect transistor 8 is maintained with a difference between the gate voltage and the source voltage of −0.99 V. Drain voltage Vin of semiconductor switching element 1 appears at output node N9 of voltage clamp circuit 7.

Therefore, by setting the full scale of oscilloscope 11 to 2 V, oscilloscope 11 is not saturated even at a time point of the off-state of semiconductor switching element 1 and the on-voltage is measured with an accuracy of 0.02 V when the accuracy of oscilloscope 11 is 1%. Thus, the on-resistance of semiconductor switching element 1 can be obtained.

Second Embodiment

Figure 4:
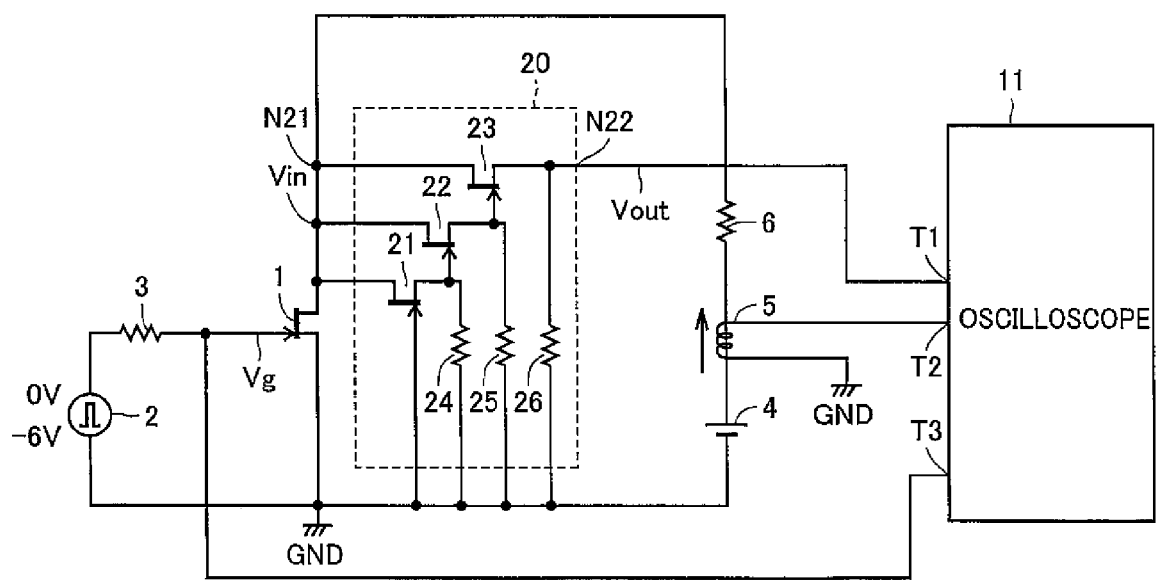
FIG. 4 is a circuit block diagram showing a configuration of a semiconductor evaluation device according to a second embodiment of the present invention.

FIG. 4 is a circuit block diagram showing a configuration of a semiconductor evaluation device according to the second embodiment of the present invention, which is to be compared with FIG. 1. With reference to FIG. 4, the semiconductor evaluation device differs from the semiconductor evaluation device of FIG. 1 in that voltage clamp circuit 7 is replaced by a voltage clamp circuit 20.

Voltage clamp circuit 20 includes normally-on type field-effect transistors 21 to 23 and resistance elements 24 to 26. Each of field-effect transistors 21 to 23 has a negative threshold voltage (e.g., −2V), and drains thereof are all connected to an input node N21. The gate of field-effect transistor 21 is grounded, the sources of field-effect transistors 21 and 22 are connected to the gates of field-effect transistors 22 and 23, respectively, and the source of field-effect transistor 23 is connected to an output node N22. As field-effect transistors 21 to 23, elements having high breakdown voltage and being capable of operating at high speed are desirable, and elements made of so-called wide band-gap semiconductors including nitride semiconductors such as GaN and AlGaN and SiC are suitable. Elements formed of GaN are used here as field-effect transistors 21 to 23.

Resistance elements 24 to 26 are connected between the sources of field-effect transistors 24 to 26 and the line of ground voltage GND, respectively. Input node N21 is connected to the drain of semiconductor switching element 1, and output node N22 is connected to first input terminal T1 of oscilloscope 11. The resistance value of each of resistance elements 24 to 26 is, e.g., 20 kΩ.

Due to the normally-on type of field-effect transistors 21 to 23, when a current flows through resistance elements 24 to 26 to cause the voltage drop of resistance elements 24 to 26, the voltage drop causes increases of the voltages on the source side of field-effect transistors 21 to 23. At this point, when the difference voltage between the gate voltage (0 V) and source voltage Vout of field-effect transistor 21 becomes lower than the threshold voltage (−2 V), field-effect transistor 21 is turned off, causing the source voltage of field-effect transistor 21 to be clamped to 2 V.

Also, when the difference between the gate voltage (2 V) and source voltage of field-effect transistor 22 becomes lower than the threshold voltage (−2 V), field-effect transistor 22 is turned off, causing the source voltage of field-effect transistor 22 to be clamped to 4 V. Further, when the difference voltage between the gate voltage (4 V) and source voltage of field-effect transistor 23 becomes lower than the threshold voltage (−2 V), field-effect transistor 23 is turned off, causing the source voltage of field-effect transistor 23 to be clamped to 6 V. Accordingly, voltage Vout at output node N22 is limited to be at most clamp voltage Vc (=6 V), and therefore the range of the voltage at first input terminal T1 of oscilloscope 11 may be set to one wide enough for Vc.

When Vg is raised from Vgoff to Vgon, semiconductor switching element 1 is turned on, so that drain voltage Vin abruptly drops, and when Vin becomes not more than Vc, Vout=Vin. The on-resistance of semiconductor switching element 1 to be evaluated is 50Ω. Vin becomes the voltage obtained by dividing DC power supply voltage (100 V) by the on-resistance (50Ω) of semiconductor switching element 1 and the resistance value (1 kΩ) of load-resistance element 6, and Vin=4.8 V in this second embodiment. At this point, field-effect transistor 23 is in the on-state. In such field-effect transistor 23, source voltage Vout=Vin is 4.8 V, so that the difference between the gate voltage (4 V) and the source voltage (4.8 V) is 4 V−4.8 V=−0.8 V. Since the threshold voltage of field-effect transistor 23 is −2V, the on-state of field-effect transistor 23 is maintained with a difference between the gate voltage and the source voltage of −0.8 V. Drain voltage Vin of semiconductor switching element 1 appears at output node N22 of voltage clamp circuit 20.

Therefore, by setting the full scale of oscilloscope 11 to 6 V, oscilloscope 11 is not saturated even at a time point of the off-state of semiconductor switching element 1 and the on-voltage is measured with an accuracy of 0.06 V when the accuracy of oscilloscope 11 is 1%. Thus, the on-resistance of semiconductor switching element 1 can be obtained.

In this second embodiment, voltage clamp circuit 20 is configured using a plurality of field-effect transistors 21 to 23, allowing for cases of high on-resistance of semiconductor switching element 1 to be evaluated and cases of small threshold voltage of each of field-effect transistors 21 to 23.

Note that three field-effect transistors 21 to 23 are used in this second embodiment. However, it will be appreciated that the same voltage clamp circuit can be configured also using two or four or more field-effect transistors.

In addition, as shown in the first embodiment, the gate of field-effect transistor 21 may be provided with the output voltage of variable DC power supply 10. In this case, clamping voltage Vc is the sum of the total sum (6 V) of absolute values of threshold voltages of field-effect transistors 21 to 23 and the output voltage of variable DC power supply 10. Therefore, clamping voltage Vc can be adjusted by adjusting the output voltage of variable DC power supply 10.

Third Embodiment

Figure 5:
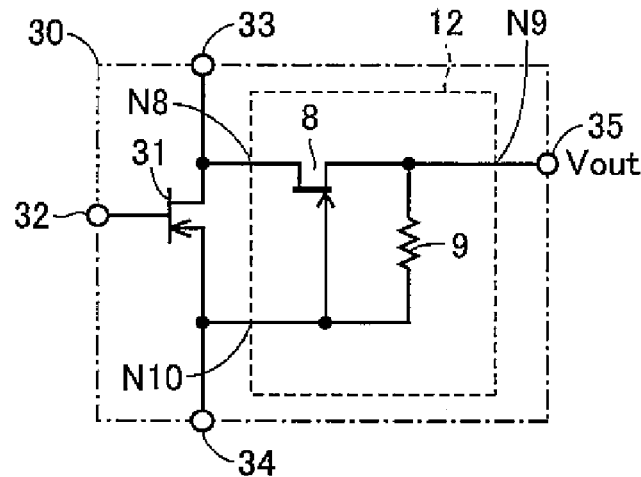
FIG. 5 shows a configuration of a semiconductor device according to a third embodiment of the present invention.

FIG. 5 is a circuit diagram showing a configuration of a semiconductor device (semiconductor chip) 30 according to the third embodiment of the present invention. In FIG. 5, semiconductor device 30 includes a semiconductor switching element (e.g., N-type field-effect transistor) 31, voltage clamp circuit 12 and terminals (electrode pads) 32 to 35. These components are formed on a surface of one semiconductor substrate (not shown). Semiconductor switching element 31 has a gate connected to input terminal 32, a drain connected to power supply terminal 33, and a source connected to ground terminal 34.

Voltage clamp circuit 12 includes field-effect transistor 8 and resistance element 9 as shown in FIG. 3. Field-effect transistor 8 has a drain connected to input node N8, a source connected to output node N9, and a gate connected to a ground node N10. Voltage clamp circuit 12 has input node N8 connected to power supply terminal 33, output node N9 connected to output terminal 35, and ground node N10 connected to ground terminal 34.

In the manufacturing process, an epitaxial layer having a sheet resistance of 400 ohms/square formed on a surface of a semiconductor substrate. Semiconductor switching element 31 is formed using the epitaxial layer, and a region with a width of 5 μm and a length of 50 μm of the epitaxial layer is isolated, thereby forming resistance element 9 having a resistance value of 4 kΩ. Contacts among field-effect transistor 8, semiconductor switching element 31 and resistance element 9 are formed in a series of processes of forming semiconductor switching element 31. Also, in a process of wiring by using Au, the drain electrode of field-effect transistor 8 is connected to the drain electrode of semiconductor switching element 31, the gate electrode of field-effect transistor 8 is connected to the source electrode of semiconductor switching element 31, the source electrode of field-effect transistor 8 is connected to one end of resistance element 9, and the other end of resistance element 9 is connected to the source electrode of semiconductor switching element 31. Also, terminals 32 to 34 are formed at the gate electrode, the drain electrode and the source electrode of semiconductor switching element 31, respectively, and terminal 35 is formed at the source electrode of field-effect transistor 8, allowing connection with the outside of the chip.

The on-resistance of semiconductor switching element 31 is 10 mΩ, and the threshold voltage of field-effect transistor 8 is −2 V. When, with a voltage of 100 V applied between terminals 33 and 34, semiconductor switching element 31 is turned off, voltage Vout of output terminal 35 becomes clamping voltage Vc=2 V. When semiconductor switching element 31 is turned on for a current of 5 A to flow, output voltage Vout becomes 0.05 V. When semiconductor switching element 31 is turned on for a current of 10 A to flow, output voltage Vout becomes 0.1 V. The current of semiconductor switching element 31 can therefore be monitored with a voltmeter having a breakdown voltage of 20 V.

Note that voltage clamp circuit 12 may be replaced by voltage clamp circuit 7 of FIG. 1 and may also be replaced by voltage clamp circuit 20 of FIG. 4.

Note also that the semiconductor substrate and the epitaxial layer of semiconductor device 30 are preferably wide band-gap semiconductors but may be made of silicon.

Figure 6:
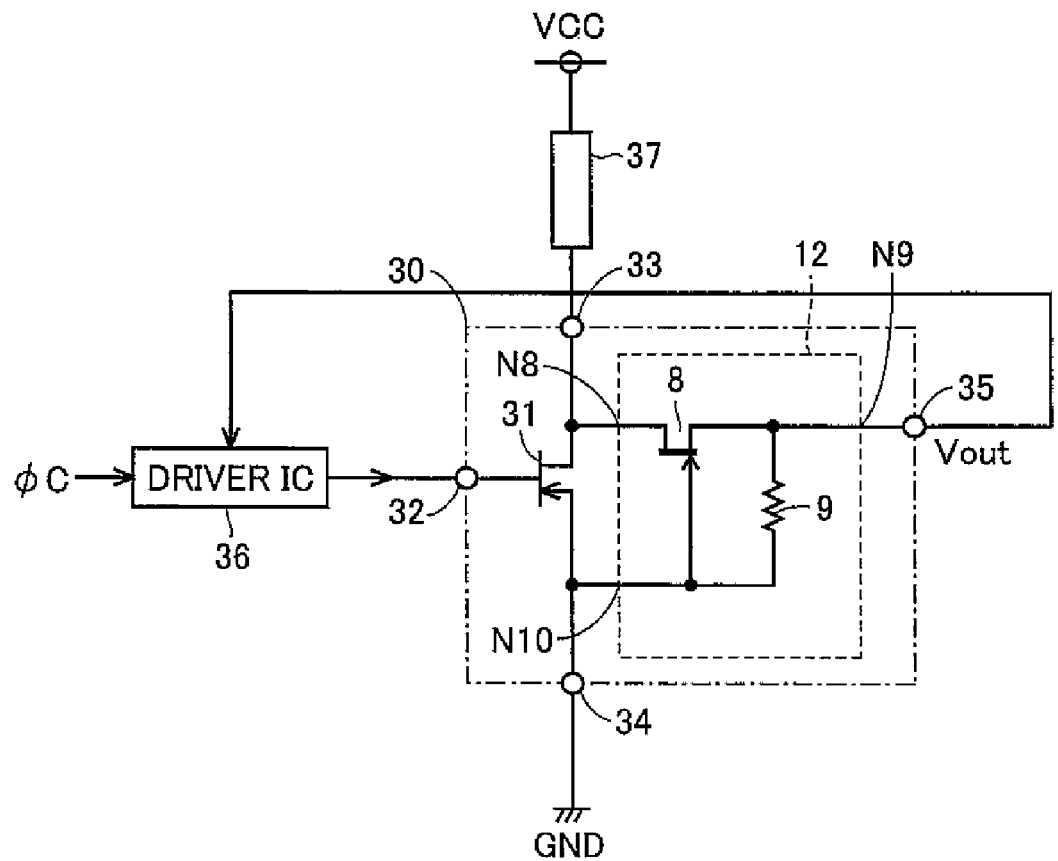
FIG. 6 is a circuit block diagram showing how to use the semiconductor device shown in FIG. 5.

FIG. 6 is a circuit block diagram showing how to use semiconductor device 30. In FIG. 6, input terminal 32 and output terminal 35 of semiconductor device 30 are connected to a driver IC 36, power supply terminal 33 is connected via a load circuit 37 to the line of a power supply voltage VCC, and ground terminal 34 is grounded. Power supply voltage VCC is 100 V, and the breakdown voltage of driver IC 36 is 10 V.

For example, when a control signal φc is at the "L" level, driver IC 36 outputs signals at the "L" level to turn off semiconductor switching element 31 to block the drive current flowing in load circuit 37. When the control signal φc is at the "H" level, driver IC 36 outputs signals at the "H" level to turn on semiconductor switching element 31 to cause the drive current to flow in load circuit 37. At this point, if the drive current of load circuit 37 exceeds 10 A and output voltage Vout of voltage clamp circuit 12 exceeds 0.1 V, driver IC 36 outputs signals at the "L" level to turn off semiconductor switching element 31 to block the drive current flowing in load circuit 37. Thus, the overcurrent protection of semiconductor switching element 31 can be performed by means of the driver IC having a low breakdown voltage of 10 V.

Fourth Embodiment

Figure 7:
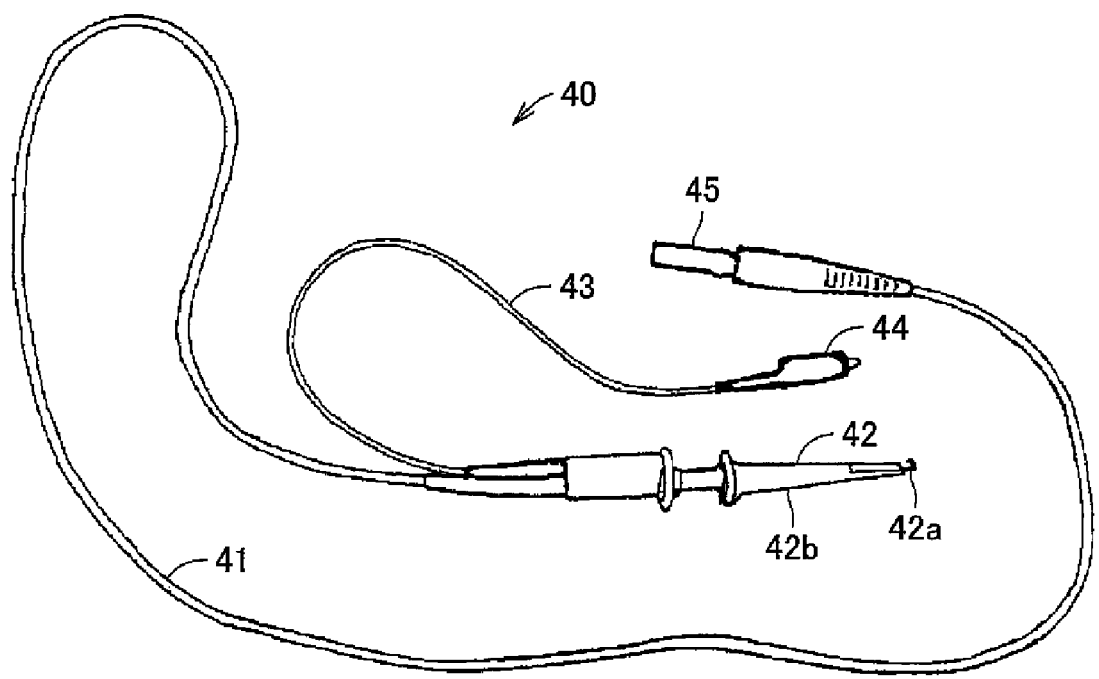
FIG. 7 shows an outline of a voltage measurement probe according to a fourth embodiment of the present invention.

FIG. 7 shows an outline of a voltage measurement probe 40 according to the fourth embodiment of the present invention. In FIG. 7, voltage measurement probe 40 includes a coaxial line 41, a probe head 42, a common lead 43, an alligator clip 44 and a connector 45. Coaxial line 41 is a well-known one having a central conductor 41a and an outer conductor 41b as shown in FIG. 8.

Probe head 42 is provided in one end of coaxial line 41 and includes a signal detection pin 42a and a tubular cover 42b made of plastics. The leading edge of signal detection pin 42a is bent in a hook shape so as to come into contact with a point of measurement or to be hooked onto the wire to be measured. The base portion of cover 42b is formed to be flexible such that the leading edge of signal detection pin 42a protrudes from a hole at the edge of cover 42b when the base portion of cover 42b is shortened by finger pressure.

Figure 8:
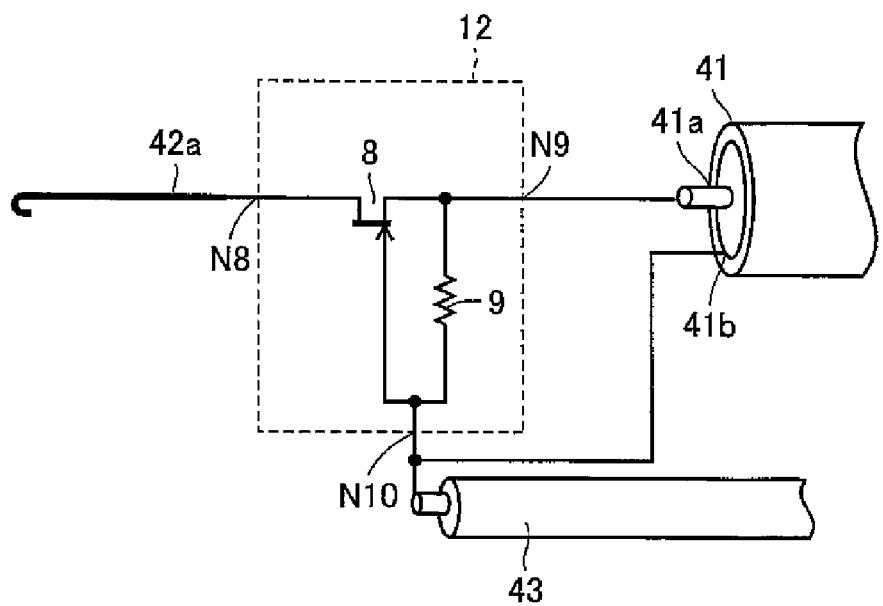
FIG. 8 is a circuit block diagram showing a main portion of the voltage measurement probe shown in FIG. 7.

The base portion of signal detection pin 42a is connected to input node N8 of voltage clamp circuit 12, and output node N9 of voltage clamp circuit 12 is connected to central conductor 41a of coaxial line 41, as shown in FIG. 8. Voltage clamp circuit 12 includes field-effect transistor 8 and resistance element 9 as shown in FIG. 3. The drain of field-effect transistor 8 is connected to input node N8, a source thereof is connected to output node N9, and a gate thereof is connected to node N10. Resistance element 9 is connected between nodes N9 and N10.

One end of common lead 43 is connected to node N10 of voltage clamp circuit 12 and outer conductor 41b of coaxial line 41. The other end of common lead 43 is connected to alligator clip 44 as shown in FIG. 7, and alligator clip 44 is connected to the line of ground voltage GND. In this way, node N10 of voltage clamp circuit 12 and outer conductor 41b of coaxial line 41 are grounded. Connected to the other end of coaxial line 41 is connector 45, and connector 45 is connected, e.g., to first input terminal T1 of oscilloscope 11.

The voltage detected with signal detection pin 42a is provided via voltage clamp circuit 12, coaxial line 41 and connector 45 to oscilloscope 11. The voltage input to oscilloscope 11 is limited to be at most clamping voltage Vc by voltage clamp circuit 12.

Note that in the semiconductor evaluation device shown in FIG. 3, voltage measurement probe 40 having voltage clamp circuit 12 built therein may be provided instead of voltage clamp circuit 12.

Also, instead of being connected to node N10, the gate of field-effect transistor 8 of FIG. 8 may be connected via an electric wire to an output terminal of a variable DC power supply. In this case, clamping voltage Vc of voltage clamp circuit 12 can be adjusted by adjusting the output voltage of the variable DC power supply.

Fifth Embodiment

Figure 9B:
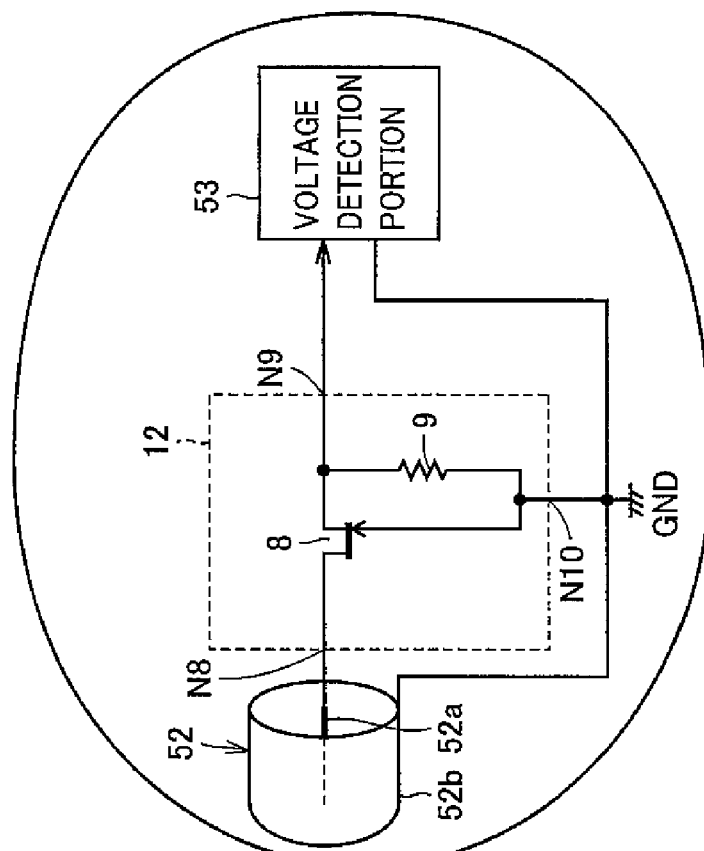
FIG. 9B is a circuit block diagram showing the configuration of the oscilloscope according to the fifth embodiment of the present invention.
Figure 9A:
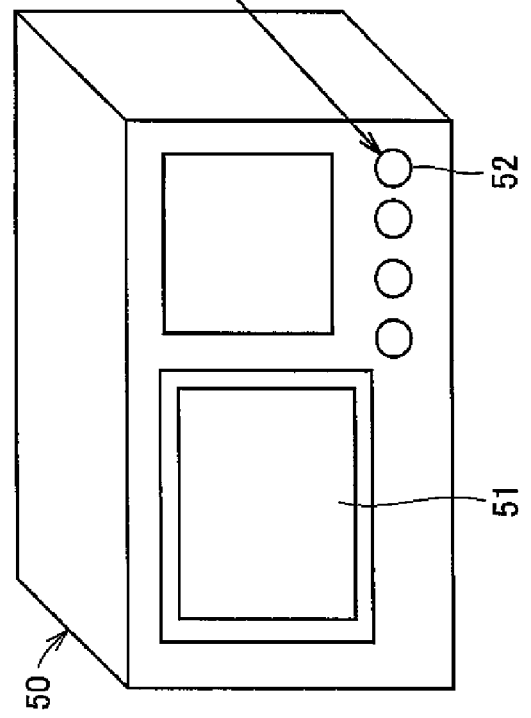
FIG. 9A shows an outline of an oscilloscope according to a fifth embodiment of the present invention.

FIG. 9A shows an outline of an oscilloscope 50 according to the fifth embodiment of the present invention, and FIG. 9B is a circuit block diagram showing a main portion in oscilloscope 50. In FIGS. 9A and 9B, provided on the front surface of oscilloscope 50 are a screen 51 displaying waveforms of detected signals, an input terminal 52 allowing signals to be input, and the like. Input terminal 52 is of a coaxial type and includes a central conductor 52a and an outer conductor 52b.

Central conductor 52a of input terminal 52 is connected to input node N8 of the built-in voltage clamp circuit 12, and output node N9 of voltage clamp circuit 12 is connected to a voltage detection portion 53. Voltage clamp circuit 12 includes field-effect transistor 8 and resistance element 9 as shown in FIG. 3. The drain of field-effect transistor 8 is connected to input node N8, a source thereof is connected to output node N9, and a gate thereof is connected to node N10. Resistance element 9 is connected between nodes N9 and N10. Node N10, outer conductor 52b and the ground node of voltage detection portion 53 are connected to the line of ground voltage GND.

A voltage that has been input to input terminal 52 is provided via voltage clamp circuit 12 to voltage detection portion 53. The voltage input to voltage detection portion 53 is limited to be at most clamping voltage Vc by voltage clamp circuit 12. Voltage detection portion 53 detects the voltage input via voltage clamp circuit 12 and displays waveforms of the detected voltage on screen 51.

Note that it may be considered in the semiconductor evaluation device shown in FIG. 3 that voltage clamp circuit 12 is removed, oscilloscope 11 is replaced by oscilloscope 50 having voltage clamp circuit 12 built therein, and the drain of semiconductor switching element 1 is connected to input terminal 52 of oscilloscope 50.

Further, voltage clamp circuit 7 of FIG. 1, instead of voltage clamp circuit 12, may be built in oscilloscope 50. In this case, clamping voltage Vc of voltage clamp circuit 12 can be adjusted by adjusting the output voltage of DC power supply 10. In this case, the output voltage of DC power supply 10 may be adjusted in accordance with the display range of oscilloscope 50 to set optimum clamping voltage Vc at all times.

Further, oscilloscope 50 having voltage clamp circuit 7 built therein, pulse generating circuit 2 and a controller for controlling DC power supplies 4 and 10 may be provided to allow the characteristics of semiconductor switching element 1 to be automatically measured.

Although the present invention has been described and illustrated in detail, it is clearly understood that the same is by way of illustration and example only and is not to be taken by way of limitation, the scope of the present invention being interpreted by the terms of the appended claims.

What is claimed is:

1. A voltage clamp circuit that transmits a voltage at an input node to an output node when the voltage at said input node is lower than a clamping voltage, and fixes a voltage at said output node to said clamping voltage when the voltage at said input node is higher than said clamping voltage, the voltage clamp circuit comprising:
   a normally-on type field-effect transistor having a negative threshold voltage; and
   a resistance element, wherein
   said field-effect transistor includes a drain connected to said input node, a source connected to said output node, and a gate receiving a first reference voltage,
   said resistance element has an electrode on one side connected to said output node and an electrode on another side receiving a second reference voltage, and
   said clamping voltage is a voltage of a sum of an absolute value of the threshold voltage of said field-effect transistor and said first reference voltage.

2. The voltage clamp circuit according to claim 1, wherein said field-effect transistor is formed of a wide band-gap semiconductor.

3. The voltage clamp circuit according to claim 1, wherein said first reference voltage is a positive voltage and said second reference voltage is a ground voltage.

4. The voltage clamp circuit according to claim 1, wherein each of said first and second reference voltages is a ground voltage.

5. A semiconductor device comprising:
   the voltage clamp circuit according to claim 1; and
   a semiconductor switching element, wherein
   said input node is provided with a voltage between terminals of said semiconductor switching element.

6. The semiconductor device according to claim 5, wherein said semiconductor switching element is formed of a wide band-gap semiconductor.

7. An overcurrent protection circuit comprising:
   the voltage clamp circuit according to claim 1, wherein
   said input node is provided with a voltage between terminals of a semiconductor switching element to be protected, and
   the overcurrent protection circuit further comprises a driver that turns off said semiconductor switching element as the voltage at said output node exceeds a predetermined voltage.

8. A voltage measurement probe comprising:
   the voltage clamp circuit according to claim 1; and
   a probe head in contact with a measurement point and electrically connected to said input node.

9. A voltage measurement device comprising:
   the voltage clamp circuit according to claim 1, wherein
   a voltage at a measurement point connected with said input node is measured from said output node.

10. A semiconductor evaluation device comprising:
    the voltage measurement device according to claim 9;
    a direct-current power supply providing a direct-current power supply voltage between terminals of a semiconductor switching element to be evaluated; and
    a pulse generating circuit turning on and off said semiconductor switching element, wherein
    said voltage measurement device measures, from said output node, a voltage between terminals of said semiconductor switching element provided to said input node.

* * * * *